United States Patent
Baier et al.

(10) Patent No.: US 6,749,058 B2
(45) Date of Patent: Jun. 15, 2004

(54) CONVEYOR AND FIXING UNIT FOR SUBSTRATES

(75) Inventors: Georg Baier, Berwangen (DE); Hartmut Drose, Waiblingen (DE)

(73) Assignee: Ekra Eduard Kraft GmbH, Bonnigheim (DE)

( * ) Notice: Subject to any disclaimer, the term of this patent is extended or adjusted under 35 U.S.C. 154(b) by 0 days.

(21) Appl. No.: 10/115,435

(22) Filed: Apr. 3, 2002

(65) Prior Publication Data

US 2002/0185810 A1 Dec. 12, 2002

(30) Foreign Application Priority Data

Apr. 10, 2001 (DE) .............................. 10117873

(51) Int. Cl.[7] .............................................. B65G 15/10
(52) U.S. Cl. ...................................................... 198/817
(58) Field of Search ............................... 198/817, 346.3

(56) References Cited

U.S. PATENT DOCUMENTS

| | | |
|---|---|---|
| 5,722,527 A | 3/1998 | Van Gastel et al. |
| 5,772,768 A | 6/1998 | Inagaki et al. |
| 5,791,453 A | 8/1998 | Schmits et al. |
| 5,871,325 A * | 2/1999 | Schmidt et al. ......... 198/817 X |
| 6,354,430 B1 * | 3/2002 | Oe ........................ 198/817 X |
| 6,453,548 B1 * | 9/2002 | Hidese ................... 198/817 X |

FOREIGN PATENT DOCUMENTS

| | | |
|---|---|---|
| EP | 0317213 | 5/1989 |
| EP | 0917414 A1 | 5/1999 |

OTHER PUBLICATIONS

EKRA Eduard Kraft GmbH, Printer System Manual, Nov. 6, 1999, pp. 3–13 and 3–14.

* cited by examiner

*Primary Examiner*—James R. Bidwell
(74) *Attorney, Agent, or Firm*—Rankin, Hill, Porter, & Clark LLP

(57) ABSTRACT

A conveyor and fixing unit are provided for fitting in a printing machine, which can be used to apply solder paste to a substrate, for example, a printed circuit board, at predetermined points. The substrate may also be a ceramic object, a flexible tape, a wafer, or other body suitable for the material to be applied. The material may also be an adhesive, silicone or epoxy resin. In order to execute a printing process for the application of solder paste, the substrate to be printed is conveyed by the conveyor unit from a substrate stack to the printing machine, where the substrate is aligned relative to a mask there provided, and solder paste is then applied to the areas of the printed circuit board to be printed by means of a doctor blade.

7 Claims, 11 Drawing Sheets

A-A

A-A

CONVEYOR AND FIXING UNIT FOR SUBSTRATES

TECHNICAL FIELD OF THE INVENTION

The present invention relates to a device for the conveying and releasable fixing of substrates to be printed.

A conveyor and fixing unit are provided in particular for fitting in a printing machine which is to be used to apply solder paste to a substrate in the form, for example, of a printed circuit board, at predetermined points (pads). The substrate may also be a ceramic object, a flexible tape, a wafer or any other body suitable for the material application. Besides solder paste, the material to be applied may also be an adhesive, silicone or epoxy resin. In order to execute a printing process for the application of, for example, solder paste, the substrate to be printed is conveyed by the conveyor unit for example from a substrate stack to the printing machine, where the substrate is aligned relative to a mask provided there, and solder paste is then applied to the areas of the printed circuit board to be printed by means of a doctor blade.

During the printing process it is necessary for the substrate to be fixed, in order to prevent it from slipping from the position In which it is aligned relative to the mask, since this would lead to an undesired printed image, as for example a wetting of pad intermediate spaces with solder paste or insufficient coverage of the pads with solder paste.

BACKGROUND OF THE INVENTION

For timed and localized fixing of the substrate it is already known that the substrate may be fixed by a clamping process at the substrate side edges, wherein the substrate is clamped by a movable guide cheek against a stationary guide cheek. This clamping leads to a clamping pressure force in the plane of the substrate, referred to below as the fixing plane.

During the actual printing process the substrate is supported from below by supports, since the doctor blade exerts a compressive force on the substrate. This compressive force leads to warpage of the substrate from the fixing plane defined above, since there is no support in the edge zone (conveyance zone). Because of this lack of support, thin substrates in particular are unable to absorb these doctor blade forces in the edge zone, leading to downwards movement of the substrate and leading in turn to the upwards warpage of the substrate in the center described above. Due to the bending of the substrate, positioning inaccuracies occur over the surface of the substrate between the substrate and the mask, or the substrate top to be printed and the mask bottom, so that the desired coverage of the pads on the substrate with solder paste does not occur. The problem described above occurs especially with very thin substrates, which have an increased tendency to bend.

SUMMARY OF THE INVENTION

It is an aspect of the present invention to eliminate the problem described, by creating a conveyor and fixing unit for a printing machine which avoids bending of the substrate and thereby facilitates the most even possible coverage of the pads over the whole of the substrate surface to be printed.

The invention creates a unit for the conveyance and releasable fixing of substrates to be printed during a printing process, wherein the unit has a conveyor device which conveys the substrate to a fixing device which in turn fixes the substrate by means of contact with side edge areas of the substrate arranged in the direction of conveyance, and has support means on which the substrate lies in the area of the side edges. This enables the substrate to lie on the support means during fixing and printing, and specifically in the area of the edge areas of the substrate which are at the side in the direction of conveyance, so that the substrate in the form for example of a printed circuit board is supported from below, thereby avoiding warpage of the printed circuit board.

Consequently when the printed circuit board is releasably fixed for the printing process by the conveyor and fixing unit according to the invention, then the printed circuit board is supported not only in its center, i.e. within the side edges, but also directly at the side edges, thereby avoiding any downwards bending of the side edges relative to the longitudinal center axis of the printed circuit board in the direction of conveyance in the side edge area. The device according to the invention therefore provides a largely plane-parallel alignment of the printed circuit board in the plane in which the doctor blade is guided over the mask during the printing process, resulting in an even coverage of the printed circuit board pads with solder paste.

According to an advantageous development of the invention it is provided that the support means are in the form of tongue-shaped support elements spaced apart, which support from below the side edge areas running in the direction of conveyance of the printed circuit board.

The tongue-shaped support elements may be an integral part of a support bar, with conveyor rollers in the area between the individual support elements on which the substrate may be conveyed into, and also away from, the area of the fixing device. By this means the substrate to be printed may be placed via a feeder device on to the conveyor device, which then conveys the substrate into the area of the support bar with the tongue-shaped supports, which have conveyor rollers arranged between them. The substrate is then fixed for the printing process by means of the fixing device so that the top of the printed circuit board to be printed with the pads to be printed is aligned with the mask cut-outs, resulting in the printable substrate top side lying plane-parallel on the mask underside.

If the inventive conveyor and fixing unit is used to hold very thin substrates in place for the printing process, then it is also possible to provide the fixing device with hold-down strips which act on the side edge areas of the substrate from above, pressing them against the support elements so that the thin substrate is pressed against the support elements, thereby providing additional fixing. For good contact, these hold-down strips are therefore able to give additional reinforcement to the linear contact between the bottom of the substrate and the top of the support elements.

The substrate is therefore conveyed by the conveyor device into the area of the fixing device which, according to an embodiment of the invention, may be lowered relative to the conveyor device, with the support elements and the hold-down strips moving together to clamp the substrate during the lowering process. The lowering of the fixing device thus causes the support elements and the hold-down strips to move towards one another so as to clamp the substrate between them in the manner according to the invention.

The conveyor rollers already referred to above are able to move the substrate, via a drive provided on the fixing device, into the intended clamping position after handover of the substrate from the conveyor device. On completion of the printing process they are able to transfer the substrate from the area of the fixing device back to the conveyor device for movement away from the area of coverage of the printing machine. This enables a printing machine provided with the device according to the invention to automatically accept and print substrates and to convey them onwards.

For this purpose the conveyor device may have conveyor belts on which the substrate lies during conveyance and by which the substrate is conveyed into the area of the fixing device, from which it is removed after the printing process has taken place.

BRIEF DESCRIPTION OF THE DRAWINGS

The invention is described in detail below with the aid of the drawings, which show in.

BEST MODE FOR CARRYING OUT THE INVENTION

Figure 1:
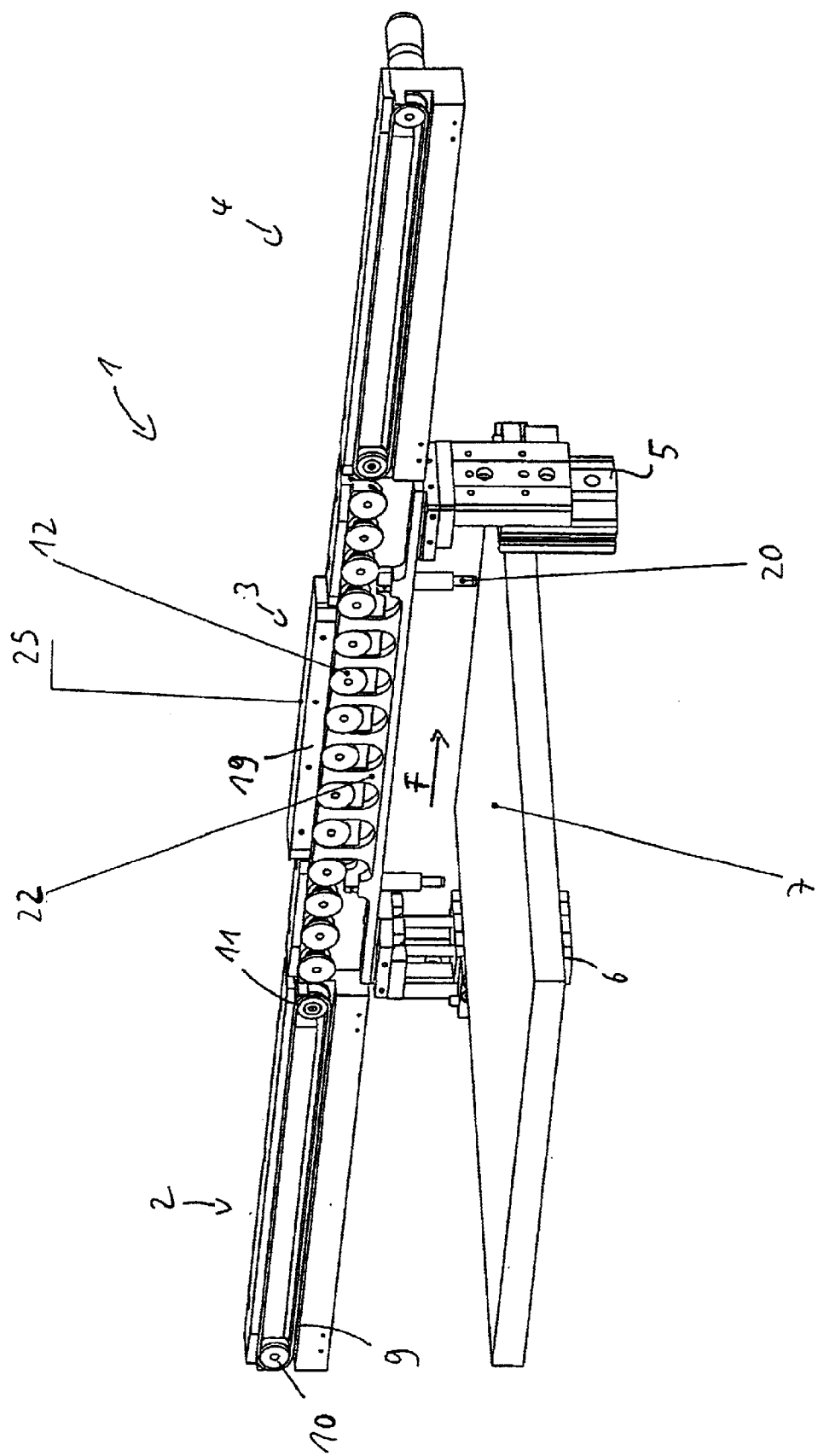
FIG. 1 a perspective view of half of a conveyor and fixing unit according to the invention.

FIG. 1 of the drawing shows a conveyor and fixing unit 1 according to the invention in a perspective view wherein to improve presentation only one half of the unit 1 is shown. The depicted embodiment is suitable for so-called in-line operation of an automatic printing machine in which a substrate to be printed, for example in the form of a printed circuit board, is conveyed inwards to the printing machine—not shown in detail—by the conveyor device 2 in the left-hand side of the drawing, until it reaches the area of the fixing device 3 where it is printed. It is then conveyed out of the printing machine over the conveyor device 4 in the right-hand plane of the drawing. Here the printing machine communicates with machines connected on the feed side (conveyor device 2) and on the discharge side (conveyor device 4).

Figure 7:
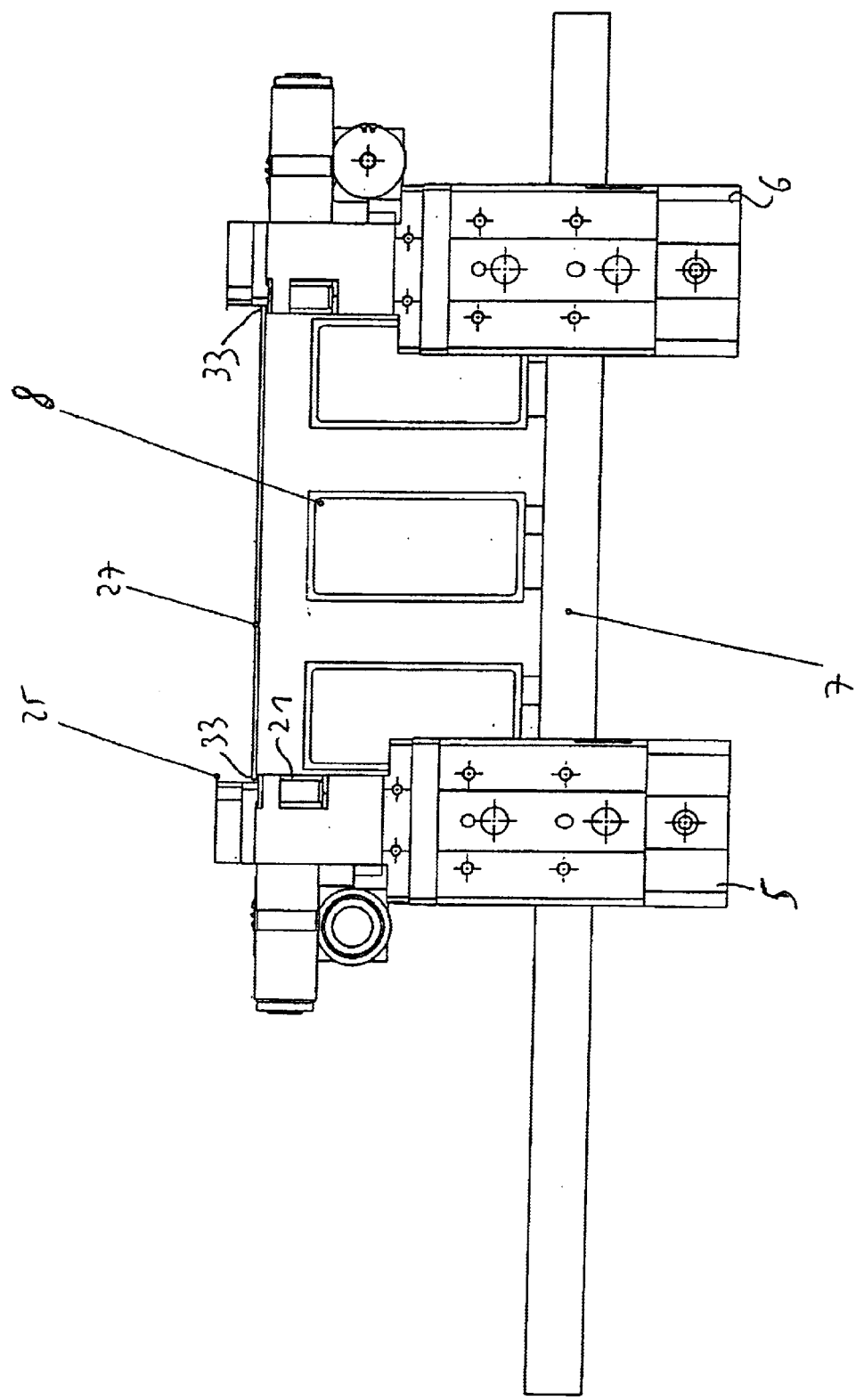
FIG. 7 a view in the direction of conveyance of a substrate arranged in the fixing device.

FIG. 1 also shows a compound-table top 7 of the printing machine, fitted to mountings 5, 6, on which supports 8 visible in more detail in FIG. 7 of the drawing may be arranged. To improve presentation these supports have been omitted from FIG. 1.

The conveyor device 2 has a revolving conveyor belt 9, driven via a drive roller 10 on which is mounted a drive motor not visible because of the perspective view, and with a support roller 11 used to reverse the direction of rotation of the conveyor belt 9. Conveyor device 4 is of similar design, with a drive motor for the conveyor belt also being visible in this case.

When a substrate to be printed is fed into the printing machine, it may reach the effective zone of the conveyor device 2 for example via a feeder device. From the conveyor device it is conveyed over the conveyor belt 9 towards the fixing device 3, and specifically in such a way that it lies upon the conveyor belt 9 and specifically by means of the side edge areas of the substrate which run in the direction of conveyance (arrow F).

Figure 3:
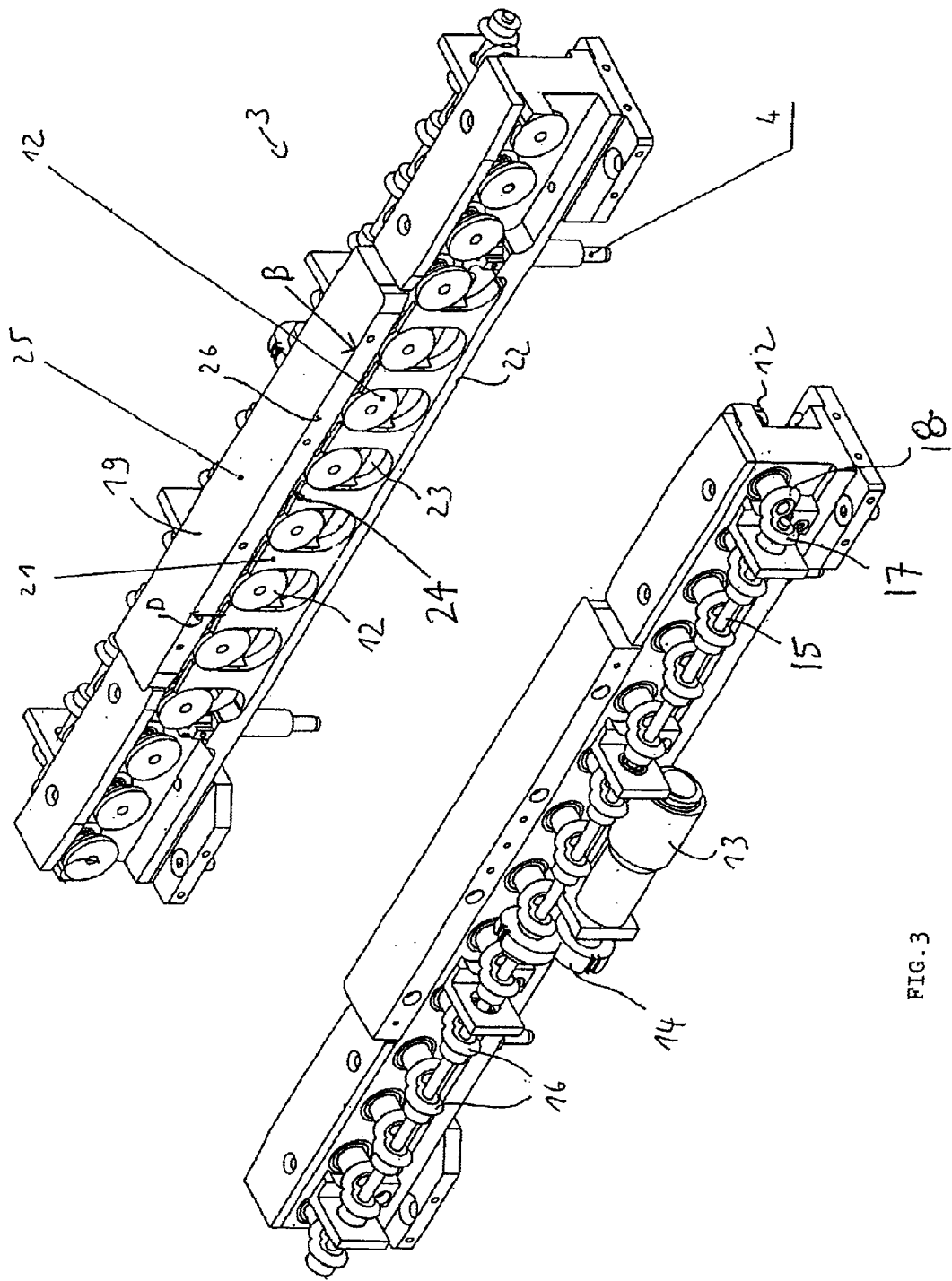
FIG. 3 a perspective view of both halves of the fixing device according to the invention.

As soon as the substrate reaches the effective zone of the fixing device 3 it runs on conveyor rollers 12, which may be driven by means of a drive 13 (see FIG. 3). Here, via a gear step 14, the drive 13 drives a shaft 15 on which are arranged a multiplicity of gear steps 16 in the form for example of bevel gears 17, which engage with complementary bevel gears 18 of the conveyor rollers 12. Consequently when the drive motor 13, which may be electric, drives the gear step 14, then the shaft 15 with the bevel gears 17 rotates and in turn drives the multiplicity of conveyor rollers 12 of the fixing device 3.

The conveyor rollers 12, thus driven, convey the substrate taken over from the conveyor device 2 up to a coverage position, monitored for example by a sensor, within the two halves of the fixing device 3, at which point the drive 13 is stopped. The substrate is now in the conveyance direction F at the level of clamping strips 19, at which point it is to be releasably fixed for the printing process. In this position the substrate lies on the support rollers 12 which are located beneath the clamping strip 19.

For the clamping process, reference is made below to FIG. 2 of the drawing.

The fixing device 3 is lowered relative to the conveyor device 2, 4 until guides 20 provided on the fixing device 3 come to rest on the compound-table top 7. As a result of this movement the conveyor rollers 12, arranged in intermediate spaces 23 between tongue-shaped support elements 21 formed integrally as part of the support bar 22, dip into the intermediate spaces 23 and the tongue-shaped support elements 21 make contact with the underside of the substrate, thereby supporting from below the substrate side edge areas 33 in the direction of conveyance F (FIG. 7).

FIG. 3 of the drawing shows the tongue-shaped support elements 21 formed integrally as part of the support bar 22 in an enlarged view, and makes clear that the substrate comes to rest on the upper side of the support elements when the conveyor rollers 12 are lowered into the intermediate space 23.

Figure 2:
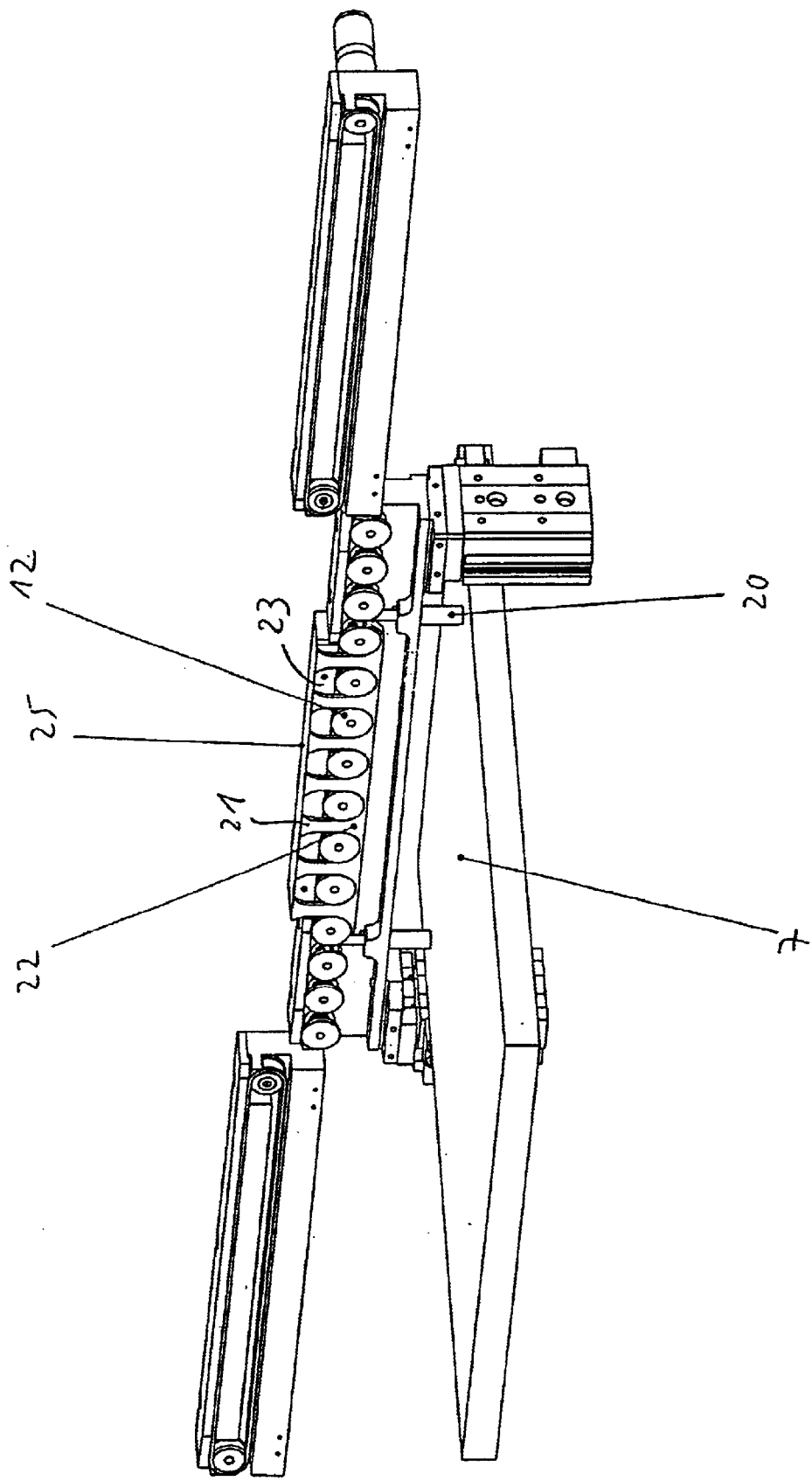
FIG. 2 a view similar to that of FIG. 1 with the fixing device lowered relative to the conveyor device.

The lowering movement of the fixing device 3 shown in FIG. 2 of the drawing reduces the clearance D (see FIG. 3) between the top 24 of the tongue-shaped support element 21 and the underside of a hold-down strip 25 provided on the top of the clamping strip 19. In the direction of arrow B (see FIG. 3), the hold-down strip extends slightly beyond the front edge 26 of the clamping strip 19 assigned to the substrate.

Figure 9:
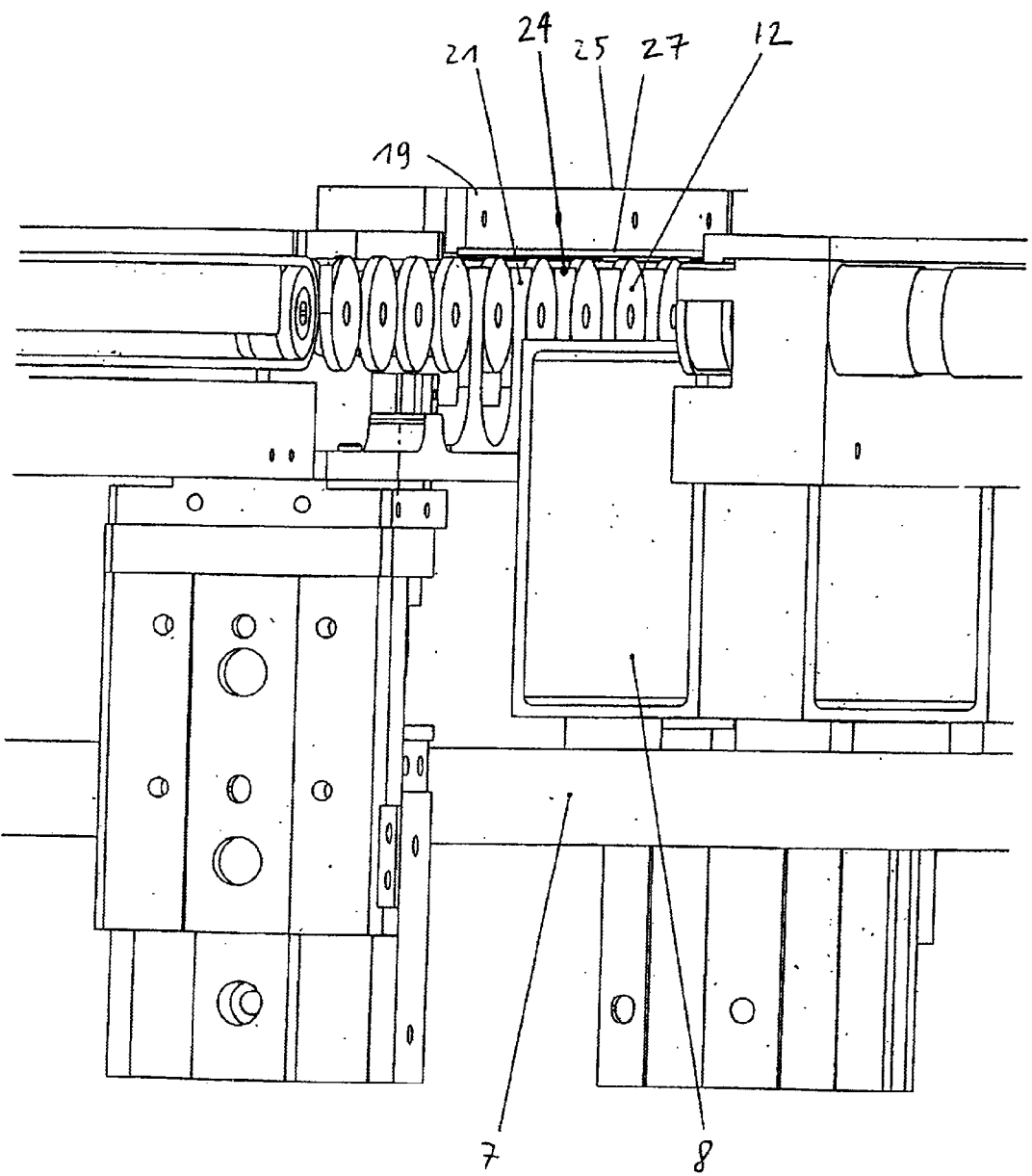
FIG. 9 a perspective view of the device according to the invention, looking in the direction of conveyance of the substrate.
Figure 10:
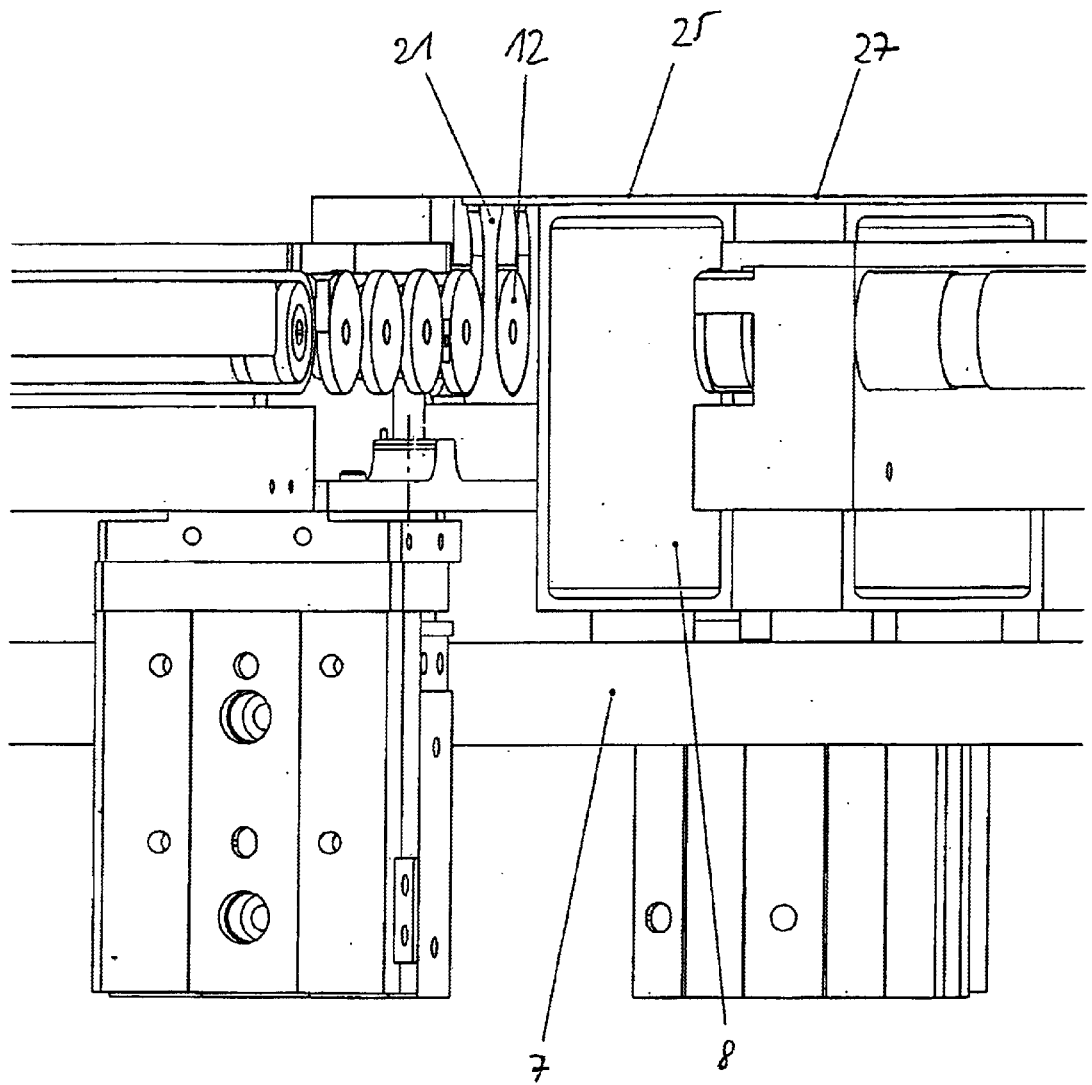
FIG. 10 a view similar to that of FIG. 9 in the lowered position.

At this point reference may be made to FIG. 9 and FIG. 10 of the drawing, the substrate 27 has arrived in the area of coverage of the fixing device 3 with the clamping strip 19 and the hold-down strip 25, with FIG. 9 also showing the non-lowered position of the fixing device 3 depicted in FIG. 1, then the drive motor 13 is stopped and the fixing device 3 is lowered from the plane of the conveyor device 2, 4 in the direction of the compound-table top 7.

In this process the conveyor rollers 12 dip into the intermediate spaces 23 of the support bar 22, so that the underside of the substrate 27 comes to rest on the top 24 of the tongue-shaped support elements 21 and is pressed against the support elements 21 by the similarly lowered hold-down strip 25. This lowered position is shown in FIG. 10 of the drawing. FIG. 10 also shows that the underside of the substrate 27 lies on supports 8 which in turn lie on the compound-table top 7. In this state the substrate 27 is therefore supported both by the supports 8 and also by the support elements 21, thereby avoiding any bending of the substrate 27.

Figure 11:
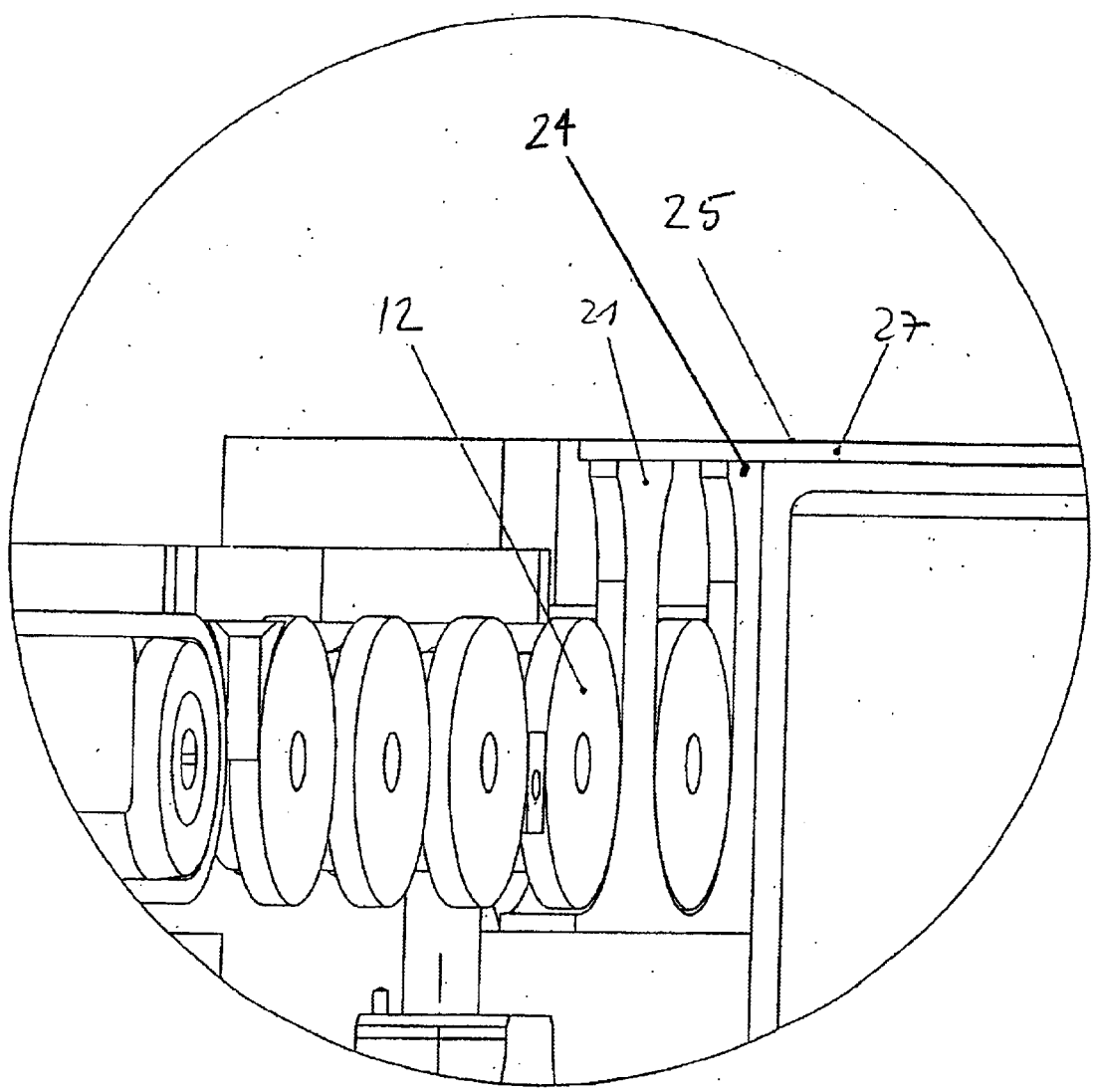
FIG. 11 an enlarged cut-out view in accordance with FIG. 10

FIG. 11 of the drawing shows an enlarged cut-out of the lowered position of FIG. 10. As is clearly apparent, the tops 24 of the tongue-shaped support elements 21 support the substrate 27 from below, and specifically in the side edge area 33 parallel to the direction of conveyance F which is especially at risk of bending without the device according to the invention.

Figure 4:
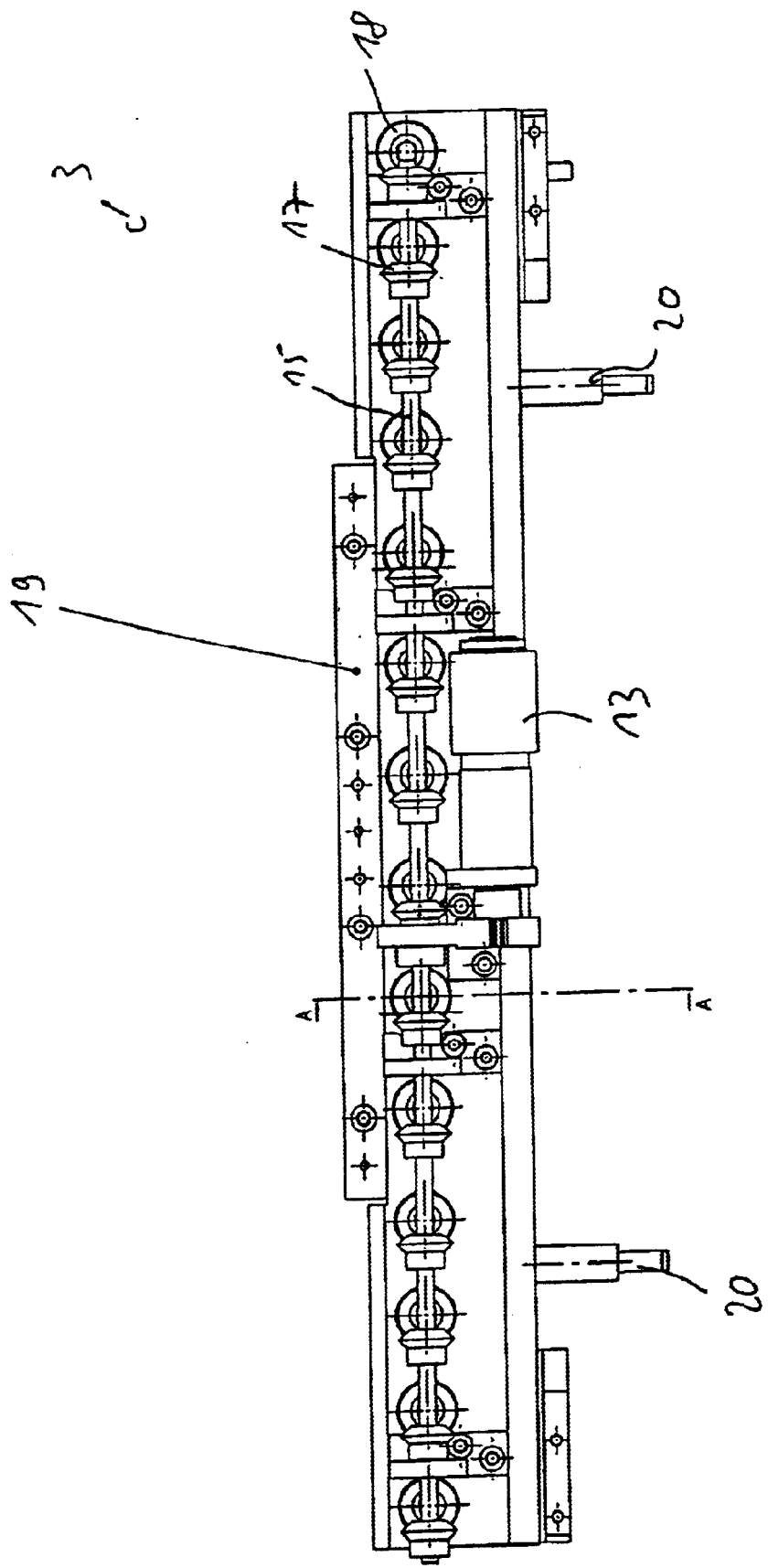
FIG. 4 a fixing device in a view from the rear, looking at a conveyor roller drive.

FIG. 4 of the drawing shows the fixing device 3 in a view from the rear with the clamping strip 19, the bevel gears 17, 18, the shaft 15, the drive motor 13 and the guides 20.

Figure 5:
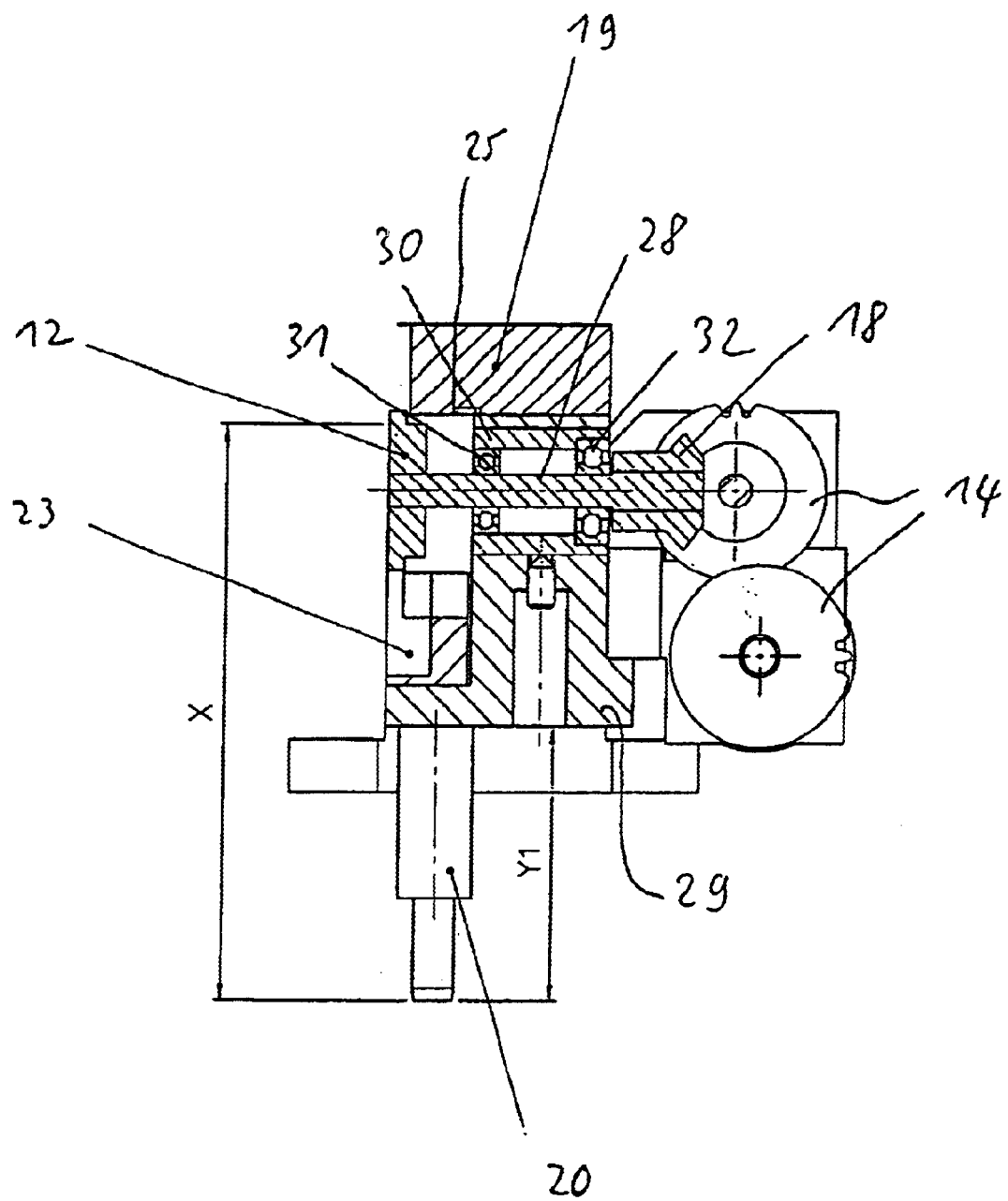
FIG. 5 a partially sectioned view along the section line A—A of FIG. 4.

FIG. 5 of the drawing shows the fixing device 3 in section A—A according to FIG. 4 of the drawing, and specifically once again in the non-lowered position. As is clearly apparent, the bevel gear 18 is driven via the gear step 14. A bevel gear shaft 28 connected to the support roller 12 passes through the bevel gear 18. At the same time the bevel gear shaft 28 is supported in a housing 29 in a bush 30, and specifically via roller bearings 31, 32. Mounted above the housing 29 is the clamping strip 19 on which is located the hold-down strip 25.

Figure 6:
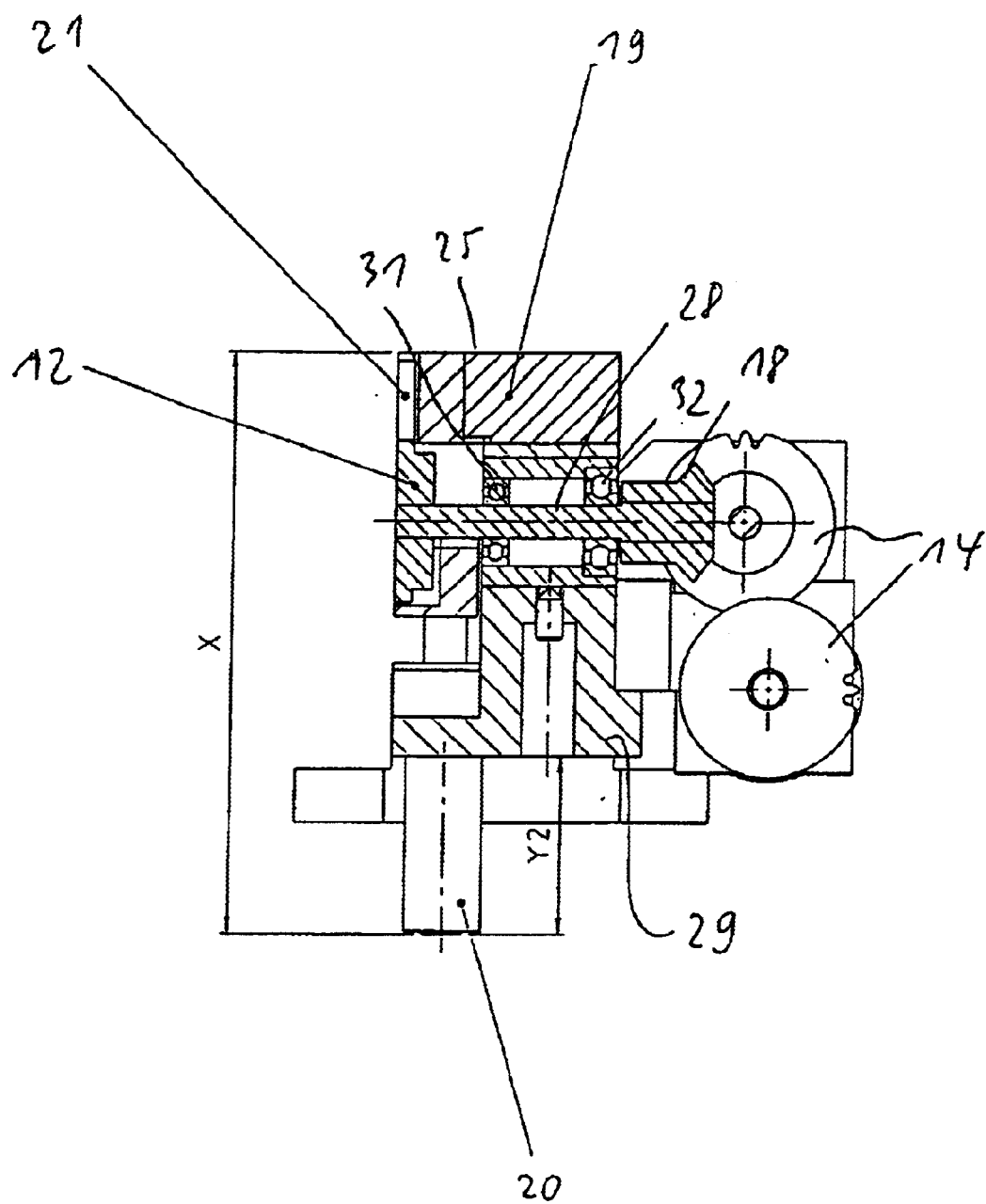
FIG. 6 a view similar to that of FIG. 5 with the fixing device lowered.

When the fixing device 3 is moved into the lowered position according to FIG. 6, the conveyor rollers 12 dip into the intermediate space 23 and the tongue-shaped support elements 21 reduce their distance D from the hold-down strip 25.

Figure 8:
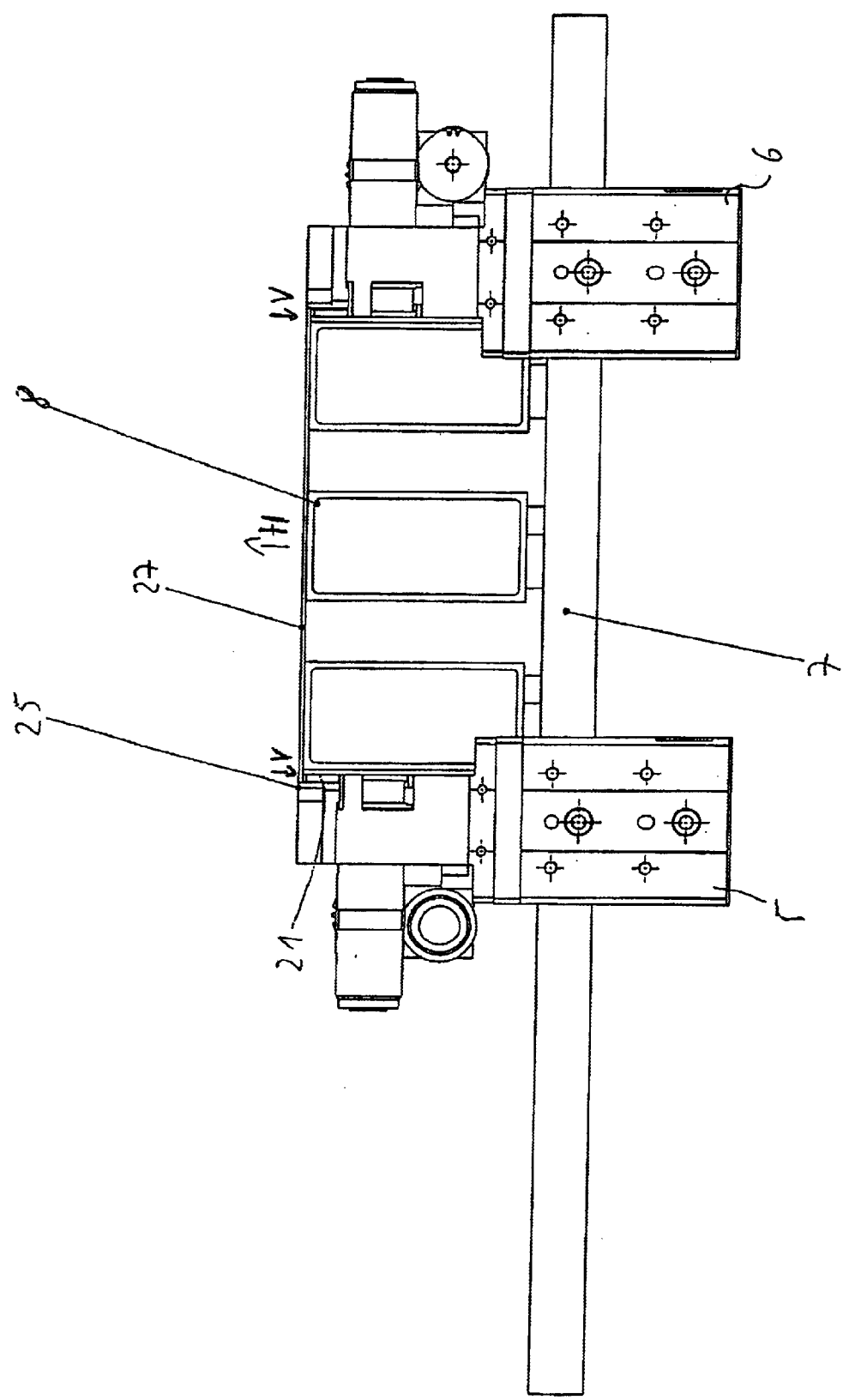
FIG. 8 a view similar to that of FIG. 7 in the lowered position of the fixing device.

Finally, FIG. 7 and FIG. 8 of the drawing now show a plan view of the conveyor and fixing unit according to the invention, with FIG. 7 showing the non-lowered position in which the substrate still rests on the support rollers 12, while FIG. 8 shows the lowered position in which the substrate lies in the printing zone on the supports 8 while being supported over the tongue-shaped support elements 21 in the area of the substrate side edges 33.

The conveyor and fixing unit 1 according to the invention therefore makes it possible, even with very thin substrates, to avoid bending of the substrate 27 at right-angles to the substrate conveyance direction F, i.e. upwards in the center in the direction of the arrow H of FIG. 8, and downwards at the side in the conveyance zone, in the direction of arrow V. The linear support of the substrate underside on the top 23 of the support elements 21 provides support for the substrate side edge areas 33, thereby eliminating the risk of bending in the area of the substrate side edges.

In accordance with a modified embodiment, not illustrated, it is also possible to attach the support bar 22 to the compound-table top 7.

Additional advantages and modifications will readily occur to those skilled in the art. Therefore, the invention in its broader aspects is not limited to the specific details and illustrative embodiments shown and described herein. Accordingly, various modifications may be made without departing from the spirit or scope of the general inventive concept as defined by the appended claims and their equivalents.

| List of reference characters | |
|---|---|
| 1 | conveyor and fixing unit |
| 2 | conveyor device (left) |
| 3 | fixing device |
| 4 | conveyor device (right) |
| 5 | mounting |
| 6 | mounting |
| 7 | compound-table top |
| 8 | supports |
| 9 | conveyor belt |
| 10 | drive roller |
| 11 | support roller |
| 12 | conveyor roller |
| 13 | drive |
| 14 | gear step |
| 15 | shaft |
| 16 | gear step |
| 17 | bevel gear |
| 18 | bevel gear |
| 19 | clamping strip |
| 20 | guides |
| 21 | support elements |
| 22 | support bar |
| 23 | intermediate space |
| 24 | top |
| 25 | hold-down strip |
| 26 | front edge |
| 27 | substrate |
| 28 | bevel gear shaft |
| 29 | housing |
| 30 | bush |
| 31 | roller bearing |
| 32 | roller bearing |
| 33 | substrate side edge |

What is claimed is:

1. A device for the conveyance and releasable fixing of substrates to be printed in a printing process, comprising:
    a conveyor device which conveys the substrate to a fixing device which fixes the substrate by means of contact with side edge areas of the substrate lying in the direction of conveyance; and,
    a support bar, comprising spaced apart tongue-shaped support elements, between which are positioned conveyor rollers, on which the substrate may be conveyed into and out of the working area of the fixing device.

2. Device according to claim 1 wherein the fixing device has hold-down strips which act upon the side edge areas of the substrate from above and press against the support elements.

3. Device according to claim 2 wherein the fixing device can be lowered relative to the conveyor device and that, on lowering, the support elements and the hold-down strips move together to clamp the substrate.

4. Device according to claim 3, wherein the fixing device has clamping strips to act with damping force on the side edge areas of the substrate, and that the clamped substrate is pressed against the support elements by means of the clamping strips.

5. Device according to claim 1, wherein the conveyor rollers may be driven, coupled together, to convey the substrate, by means of a drive provided on the fixing device.

6. Device according to claim 5 wherein in the fixed position, the fixing device lowers the substrate to be printed relative to the conveyor device in such a way that, during the printing process, the substrate rests on supports located in the area within the fixing device.

7. Device according to claim 6, wherein the conveyor device has drivable conveyor belts on which the substrate rests during conveyance and may be conveyed into and out of the area of the fixing device.

* * * * *